US006333273B1

(12) United States Patent
Kumihashi et al.

(10) Patent No.: US 6,333,273 B1
(45) Date of Patent: Dec. 25, 2001

(54) METHOD AND APPARATUS FOR DRY ETCHING

(75) Inventors: Takao Kumihashi, Musashino; Kazunori Tsujimoto, Higashi-yamato; Shinichi Tachi, Sayama, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/648,772

(22) Filed: Aug. 28, 2000

Related U.S. Application Data

(63) Continuation of application No. 09/480,477, filed on Jan. 11, 2000, now Pat. No. 6,136,721, which is a continuation of application No. 09/063,406, filed on Apr. 21, 1998, now Pat. No. 6,008,133, which is a division of application No. 08/861,600, filed on May 22, 1997, now Pat. No. 5,795,832, which is a division of application No. 08/570,689, filed on Dec. 11, 1995, now Pat. No. 5,650,038, which is a division of application No. 08/301,388, filed on Sep. 7, 1994, now Pat. No. 5,474,650, which is a continuation-in-part of application No. 08/176,461, filed on Jan. 3, 1994, now Pat. No. 5,354,418, which is a division of application No. 08/034,126, filed on Mar. 18, 1993, now Pat. No. 5,318,667, which is a continuation-in-part of application No. 07/859,336, filed on Mar. 27, 1992, now Pat. No. 5,242,539.

(30) Foreign Application Priority Data

| Apr. 4, 1991 | (JP) | 3-071464 |
| Jan. 13, 1992 | (JP) | 4-003675 |
| Mar. 10, 1992 | (JP) | 4-061736 |
| Mar. 26, 1992 | (JP) | 4-068098 |

(51) Int. Cl.$^7$ .................................................. H01L 21/00
(52) U.S. Cl. ........................ 438/714; 438/728; 438/734
(58) Field of Search .................................. 438/714, 718, 438/719, 720, 721, 724, 726, 728, 732, 734, 739, 740, 742, 744; 216/67; 156/345 P, 345 MW, 345 ME, 345 MG

(56) References Cited

U.S. PATENT DOCUMENTS

| 4,339,326 | 7/1982 | Hirose et al. . |
| 4,462,863 | 7/1984 | Nishimatsu et al. . |

(List continued on next page.)

FOREIGN PATENT DOCUMENTS

| 119455 | 9/1984 | (EP) . |
| 272140 | 6/1988 | (EP) . |
| 283306 | 9/1988 | (EP) . |
| 407169 | 1/1991 | (EP) . |
| 61-61423 | 3/1986 | (JP) . |
| 63-65628 | 3/1988 | (JP) . |
| 64-32633 | 2/1989 | (JP) . |
| 2-105413 | 4/1990 | (JP) . |

OTHER PUBLICATIONS

Abstract Nos. 26p–ZF–1, 26p–ZF–4, 28p–ZF–9, 51st Japan Society of Applied Physics Autumn Meeting, 1990, pp. 462–463.

(List continued on next page.)

*Primary Examiner*—William Powell
(74) *Attorney, Agent, or Firm*—Mattingly, Stanger & Malur, P.C.

(57) ABSTRACT

A method and apparatus for dry etching changes at least one of the effective pumping speed of a vacuum chamber and the gas flow rate to alter the processing of an etching pattern side wall of a sample between first and second conditions. The first and second conditions include the presence or absence of a deposit film, or the presence, absence or shape of a taper angle. Various parameters for controlling the first and second conditions are contemplated.

18 Claims, 13 Drawing Sheets

U.S. PATENT DOCUMENTS

| | | |
|---|---|---|
| 4,579,623 | 4/1986 | Suzuki et al. . |
| 4,842,683 | 6/1989 | Cheng et al. . |
| 4,985,109 | 1/1991 | Otsubo et al. . |
| 5,110,408 | 5/1992 | Fujii et al. . |
| 5,242,539 | 9/1993 | Kumihashi et al. . |
| 5,474,650 * | 12/1995 | Kumihashi et al. ............... 438/714 |

OTHER PUBLICATIONS

Arikado et al, "Al Tapered Etching Technology Using $10^{-3}$ Torr Magnetron Discharge Reactive Ion Etching", Proceedings of Symposium on Dry Process, 1986, pp. 48–52.

Kimura et al, "Local Etched Profile Anomaly In ECR Plasma Etching", The Electrochemical Society Spring Meeting, 191, Extended Abstracts, 91–1, pp. 670–671.

K. Ono et al, "Plasma Chemical View of Magnetron and Reactive Ion Etching of Si with Cl", Japanese Journal of Applied Physics, vol. 29, No. 10, Oct. 1990, pp. 2229–2235.

C. Dominguez et al, "Analysis of the Low Pressure Gas Composition in the Etching of Silicon", Journal of the Electrochemical Society, vol. 134, No. 1, Jan. 1987, pp. 202–205.

M. Gross et al, "Modeling of Sloped Sidewalls Formed by Simultaneous Etching and Deposition", Journal of Vacuum Science & Technology: Part B, vol. 7, No. 3, May 1989, pp. 534–541.

S.C. McNevin, "Radio Frequency Plasma Etching of Si/SiO2: Improvements Resulting from the Time Modulation of the Processing Gases", J. Vac. Sci. Technol., Part B, vol. 8, 1990, pp. 1185–1191.

Patent Abstracts of Japan, Abstract of JP–A–2052428, vol. 14, No. 218 (E–925), May 9, 1990.

C. Takahashi et al, "An Electron Cyclotron Resonance Plasma Deposition Technique Employing Magnetron Mode Sputtering", J. Vac. Sci. Technol., Part A, vol. 6, No. 4, 1988, pp. 2348–2352.

S. Samukawa, "Perfect Selective, Highly Anisotropic, and High Rate ECR Plasma Etching for N + Poly–Si and WSix/Poly–Si", Extended Abstracts of the 22nd (1990 International) Conference on Solid State Devices and Materials, 1990, pp. 207–210.

D. Widmann et al, "Technologie Hochintegrierter Schaltungen" (Halbleiter–Elektronik, Bd. 19), 1988, Springer–Verlag, Berlin, DE, pp. 193–207.

S.M. Sze, "VLSI Technology", 2nd Edition, 1988, McGraw–Hill Book Company, New York, pp. 212–220.

K. Tsujimoto et al, "High–Gas–Flow Rate Microwave Plasma Etching", Proceedings of Symposium on Dry Process, 1992, pp. 49–54.

K. Tsujimoto et al, "Novel Short–Gas–Residence–Time ECR Plasma Etching", Proceedings of the Third Electronics, Information and Systems Conference, pp. 125–128.

* cited by examiner

METHOD AND APPARATUS FOR DRY ETCHING

This is continuation application of U.S. Ser. No. 09/480,477, filed Jan. 11, 2000, now U.S. Pat. No. 6,136,721, which is a continuation application of U.S. Ser. No. 09/063,406, filed Apr. 21, 1998, now U.S. Pat. No. 6,008,133, which is a divisional application of U.S. Ser. No. 08/861,600, filed May 22, 1997, now U.S. Pat. No. 5,795,832, which is a divisional application of U.S. Ser. No. 08/570,689, filed Dec. 11, 1995, now U.S. Pat. No. 5,650,038, which is a divisional application of Ser. No. 08/301,388, filed Sep. 7, 1994, now U.S. Pat. No. 5,474,650, which is a a continuation-in-part application of U.S. patent application Ser. No. 08/176,461, filed Jan. 3, 1994, now U.S. Pat. No. 5,354,418, which is a divisional application of U.S. patent application Ser. No. 08/034,126, filed Mar. 18, 1993, now U.S. Pat. No. 5,318,667, which is a continuation-in-part application of U.S. patent application Ser. No. 07/859,336, filed Mar. 27, 1992, now U.S. Pat. No. 5,242,539, the disclosures of all of which are incorporated by reference.

BACKGROUND OF THE INVENTION

1. Field of the Invention

The present invention relates to a dry etching method and a dry etching apparatus, and, more particularly, to a high-speed exhaust dry etching method and apparatus suitable for highly selective, fine anisotropic patterning on a semiconductor.

2. Description of the Related Art

Anisotropic patterning is important in the fine patterning of semiconductor integrated circuits. In particular, dynamic random access memories (DRAMs), having a high degree of integration, require ultra fine patterning for etching the gate and storage capacitor of the MOS transistors that constitute a DRAM. Preferably, highly anisotropic patterning is realized through dry etching.

Recently, to increase the degree of integration on the DRAM, the storage capacitor has been formed on the MOS transistor. To pattern the storage capacitor, step etching has been necessary. In highly anisotropic etching, etching residue is produced on the step wall when the etching step only performs etching for film thickness. To remove the etching residue, overetching is necessary (that is, etching of more than the film thickness).

One example of an overetching method is disclosed in Japanese Patent Application Laid-Open No. 61-61423. As disclosed, a side-wall protective film is formed after the etching step before removing the etching residue through isotropic etching. To prevent an underlayer from being cut during the overetching, the method disclosed in Japanese Patent Application Laid-Open No. 63-65628 includes highly-selective etching after the formation of a side-wall protective film.

Frequently, the gate and storage capacitor of the MOS transistor are formed of polycrystalline silicon, or polycide. A method for etching polycrystalline silicon or polycide with a resist mask and chlorine- or bromine-based gas plasma is shown in "26p-ZF-1" and "26p-ZF-4" of the 51st Japan Society of Applied Physics Autumn Meeting in 1990.

The method disclosed in Japanese Patent Application Laid-Open No. 2-105413 improves the etching anisotropy by changing gases to correspond to the fine patterning. The method realizes a high anisotropy by periodically changing an etching gas and a depositing gas.

To further improve the degree of element integration, a vertical shape should be formed through highly anisotropic etching. However, the side wall should be tapered by giving an angle to it, depending upon the patterning condition after etching. An example of tapered etching is given in *Proceedings of Symposium on Dry Process* (1986), page 48, in which a depositing gas is added. Further, Japanese Patent Application Laid-Open No. 1-32633 discloses a method for performing tapered etching by utilizing the substrate temperature to control the side etching speed.

Previous techniques for changing to isotropic etching, or periodically changing the etching gas and depositing gas during overetching, require change of etching gas. Therefore, the throughput decreases because of the excessive time to change gases, and the process conditions should be optimized for each etching gas.

The known method for utilizing a resist mask and chlorine- or bromine-based gas plasma for the etching of polycrystalline silicon produces reaction products in the mask and etched layer that are activated in the plasma and reattached to a sample. This deposition from the reaction products acts as a side-wall protective film to prevent side etching, so that highly anisotropic etching can be performed. However, the amount of the deposition from the reaction products is not conventionally controlled. Therefore, excessive amounts of deposition of reaction products may produce dust and cause the yield to decrease.

When forming a side-wall protective film, the amount of deposition from reaction products changes during the etching step. For example because the etching speed is not completely constant for a single wafer, and because the thickness of an etched layer is not completely uniform, the area of the etched layer slowly decreases immediately before the etching step ends. Accordingly, the amount of reaction product deposition decreases because the number of reaction products to be produced decreases. That is, the thickness of the side-wall protective film decreases immediately before the etching step ends. As a result, the side-wall protective film becomes thin around the interface between the etched layer and the underlayer. This thin portion of the protective film is subject to breakage, causing abnormal side etching around the interface.

A similar problem may result from the method disclosed in U.S. Pat. No. 5,242,539 to Kumihashi et al. Kumihashi et al disclose a high-speed exhaust dry etching method for improving throughput by increasing the speed of the etching process, in which the effective exhaust rate is set at 500 liters/second or higher. In this method, reaction products are quickly exhausted from the processing chamber to increase the processing speed. The reaction products form side-wall protective films to suppress side etching. In this high-speed exhaust dry etching method, however, the side-wall protective film may fail to be formed to a desired thickness, resulting in side etching, which in turn deteriorates the geometrical anisotropy. Further, because the high speed exhaust dry etching also increases the etching rate of a mask, there are cases where a desired selectivity cannot be obtained. For example, where the material to be etched consists of two or more layers having different etch rates, as in a laminated film, and a layer with a low etch rate is etched, the selectivity is degraded.

Also, previous methods for performing tapered etching by adding a deposit gas have resulted in dust production and yield decrease. Controlling the tapered etching by controlling the substrate temperature has been difficult to carry out because of the difficulty in stably controlling the substrate temperature, and because much time is required to adjust the substrate temperature for fine control.

SUMMARY OF THE INVENTION

The present invention has been designed to easily carry out anisotropic etching and overetching. Further, an objective of this invention is to make the high-speed processing afforded by high-speed exhaust dry etching compatible with anisotropy and selectivity.

In a preferred embodiment, the inventive dry etching method comprises the steps of setting a sample in a vacuum chamber, supplying gas to the vacuum chamber and etching the sample with the supplied gas. At least one of the effective pumping speed of the vacuum chamber and the flow rate of the gas is changed from conditions under which a deposit film is produced on the etching pattern side wall of the sample, to conditions under which a deposit film is not produced on the side wall, or vice versa. The dry etching method may further include a step of periodically changing at least one of the effective pumping speed of the vacuum chamber and the flow rate of the gas.

In another embodiment, the inventive dry etching method may comprise the steps of setting the sample in the vacuum chamber, supplying gas to the vacuum chamber, and etching the sample, wherein at least one of the effective pumping speed of the vacuum chamber and the flow rate of the gas is changed from conditions under which the etching pattern side wall of the sample is formed into a tapered shape, to conditions under which the etching pattern side wall is formed in a vertical or undercut shape, or vice versa.

Alternatively, the conditions of the effective pumping speed of the vacuum chamber or the flow rate of the gas, or both, may be changed so that the shape of the tapered etching pattern side wall of the sample changes, or so that the number of particles of the gas entering the vacuum chamber may either increase to beyond the predetermined value, or decrease to beyond the predetermined value. In such a case, the predetermined value may be determined in accordance with the type of gas, the conditions for changing gas to plasma, or the material of the sample portion to be etched, or more than one of the above. More particularly, the predetermined value is preferably three times the number of particles entering the sample.

In a further embodiment, the dry etching method may include a step of etching a layer of the sample into a mask pattern, and an overetching step for removing etching residue, wherein the effective pumping speed of the vacuum chamber in the overetching step is set higher than that in the etching step. Further, as before, at least one of the effective pumping speed of the vacuum chamber and the flow rate of the gas may be changed from conditions under which a deposit film is produced on the etching pattern side wall of the etched layer in the etching step, to conditions under which no deposit film is produced on the etching pattern side wall of the etched layer in the overetching step.

In a further embodiment, the intensity of the plasma emission may be measured to control at least one of the effective pumping speed of the vacuum chamber and the flow rate of the treated gas in according with the measured intensity.

Finally, the area of the underlayer exposed by the etching step may be measured to control at least one of the effective pumping speed of the vacuum chamber and the flow rate of the gas in accordance with the measured area.

The invention is further directed to a dry etching apparatus for carrying out each of the methods set forth above.

Thus, the inventive dry etching apparatus preferably includes a vacuum chamber, an inlet for leading gas into the vacuum chamber, and a sample stage for supporting a sample to be etched in the vacuum chamber. Means for measuring the intensity of the plasma emission, control means for controlling the effective pumping speed of the vacuum chamber, control means for controlling the flow rate of the gas, and means for controlling at least one of the two types of control means in accordance with signals from the measuring means are preferably also included.

In another embodiment, the invention may include means for measuring the area of the underlayer exposed by the etching, means for controlling the effective pumping speed of the vacuum chamber, control means for controlling the flow rate of the gas, and control means for controlling at least one of the pumping speed and flow rate control means in accordance with signals from the measuring means.

In yet further embodiments, during the overall etching process, the effective exhaust rate in the etching chamber is changed from a first effective exhaust rate to a second effective exhaust rate. At this time, the first effective exhaust rate, which is set higher or lower than the second effective exhaust rate, may be progressively changed to the second effective exhaust rate. The change may occur between main etching and overetching steps, or may be accompanied by a change in pressure or gas flow rate.

Preferably, when a material that remains at stepped portions after the main etching step—which etches planar portions of the material—is etched by an overetching step, the effective exhaust rate during the overetching step is set higher or lower than that of the main etching step.

Also, in a process of etching a material made up of two or more layers over a plurality of layers, the effective exhaust rate is changed at least once.

DETAILED DESCRIPTION OF THE PREFERRED EMBODIMENTS

According to the present invention, then, when the effective pumping speed of the dry etching apparatus is changed, the etching characteristics also change. When other etching conditions are not changed (i.e., when only the effective pumping speed is changed), the etching characteristics change because of a change in the gas pressure. Etching characteristics also change by simultaneously varying the flow rate of the etching gas so that the pressure is kept constant.

Figure 1A:
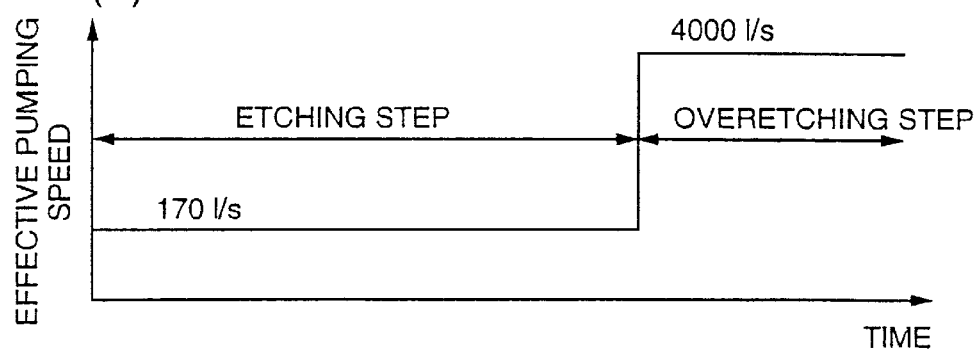
FIGS. 1(a)–(d) show timing diagrams illustrating the change in effective pumping speed, gas flow rate, gas pressure, and percentage of reaction products in accordance with elapse of time.
Figure 1B:
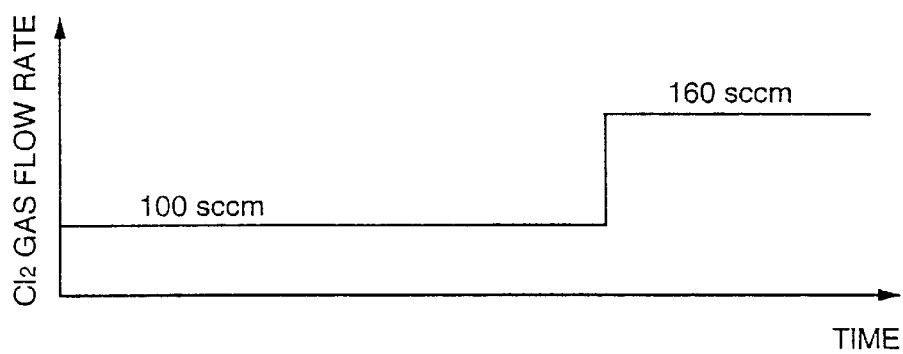
Figure 1C:
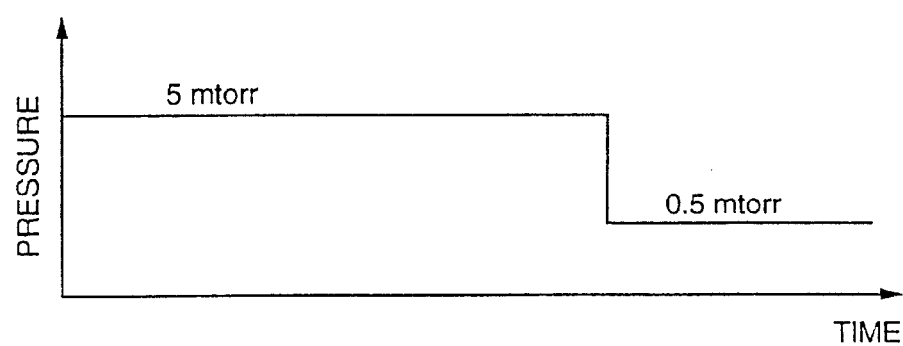
Figure 1D:
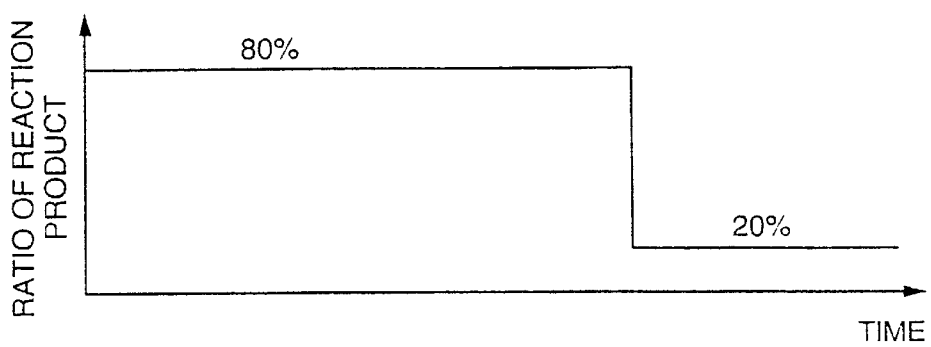
Figure 2:
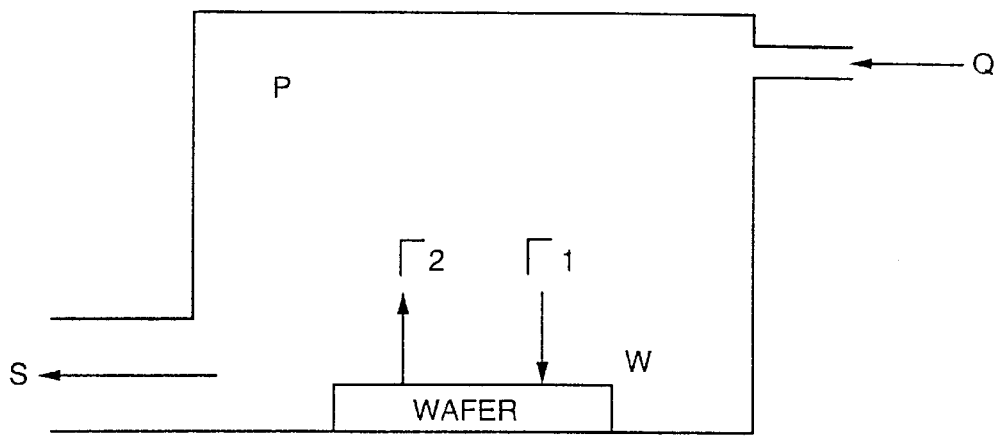
FIG. 2 illustrates the flow of gas particles in a reaction chamber.

The relationship between the effective pumping speed and the etching characteristics are considered below. With reference to FIG. 2, Q (1/s) is the number of etching gas particles entering the vacuum chamber per unit time and the S (m³/s) is the effective pumping speed of the vacuum chamber. When no etching reaction occurs, the gas pressure P in the vacuum chamber is given by the following equation:

$$P = kTQ/S \quad (1)$$

where k is the Boltzmann constant, and T is the absolute temperature of the gas.

When the etching reaction occurs, the pressure in the vacuum chamber differs from the value in equation (1). Also, the chamber contains not only the etching gas, but reaction products from the etching itself.

When analyzing the relationship between the effective pumping speed and the etching characteristics, the following two points are assumed: (1) the etching gas entering the vacuum chamber is completely consumed by the etching reaction, and (2) only one type of reaction product is produced. For example, when the incoming etching gas is chlorine gas, and the chlorine gas is used to etch a silicon substrate, the sole reaction product in the vacuum chamber is $SiCl_4$.

In practice, the primary etchant gas is a halogen atomic gas, and the rate-determining step is the supply of the etchant gas. The reaction products are stable halides. Therefore, the above assumption is reflected in practice.

The etching speed can thus be determined by the incident flux of the etching gas. The incident flux is itself determined by pressure. The number of incoming etching gas particles per unit area and unit time $\Gamma$ is proportional to the partial pressure of the etching gas $P_1$ as follows:

$$\Gamma_1 = \alpha P_1. \quad (2)$$

In this case, $\alpha$ is a constant determined by the following expression, where $m_1$ is the mass of the etching gas particle:

$$\alpha = \sqrt{1/2\pi m_1 kT}. \quad (3)$$

For a wafer area W, the etching gas consumption is $\Gamma_1 W$ per unit time. The number of etching gas particles per unit time exhausted from an exhaust system provided for the vacuum chamber is $P_1 S/kT$ (from equation (1)). Unless the pressure fluctuates, the number of incoming etching gas particles Q balances the sum of the number of etching gas particles consumed during the etching process ($\Gamma_1 W$) and the number of etching gas particles exhausted from the exhaust system $P_1 S/kT$. That is, $$Q = \Gamma_1 W + P_1 S/kT. \quad (4)$$

Substituting equation (2) for equation (4), $P_1$ is obtained as follows:

$$P_1 = kTQ/(S + \alpha kTW). \quad (5)$$

The number of reaction products $\Gamma_2$ per unit area and unit time ejected from a wafer is proportional to the number of incoming gas particles $\Gamma_1$. That is, $$\Gamma_2 = x\Gamma_1. \quad (6)$$

For example, when the etching gas particle is a chlorine atom, and the reaction product is $SiCl_4$, x equals ¼. The number of reaction products produced per unit time is $\Gamma_2 W$. Unless the pressure fluctuates, the number of reaction products produced by the etching process equals the number of reaction products ejected from the exhaust system.

The number of reaction product particles per unit time ejected from the exhaust system is $P_2 S/kT$, where $P_2$ is the partial pressure of the reaction products. That is, $$\Gamma_2 W = P_2 S/kT. \quad (7)$$

Then, substituting the equations (2) and (6) for the equation (7), $P_2$ is obtained as follows:

$$P_2 = xkT\alpha WP_1/S. \quad (8)$$

The relationship between the pressure P in the vacuum chamber, the partial pressure $P_1$ of the etching gas, and the partial pressure $P_2$ of the reaction products is given by the following expression:

$$P = P_1 + P_2. \quad (9)$$

Substituting the equations (5) and (8) for the equation (9) to eliminate $P_1$ and $P_2$, the following expression is obtained:

$$pS^2 - kT(Q - \alpha WP)S - x(kT)^2 \alpha WQ = 0. \quad (10)$$

This expression shows the relationship between the effective pumping speed and the pressure during the etching reaction.

From the equation (10), S is obtained as shown below:

$$S = \{(Q - \alpha WP) + \sqrt{(Q - \alpha WP)^2 + 4x\alpha WPQ}\}kT/2P. \quad (11)$$

Accordingly, the effective pumping speed for setting the pressure to a predetermined value can be obtained using equation (11). By substituting the value for equation (5), the partial pressure of the etching gas can be obtained. In the above consideration, all gas particles confronting the wafer are assumed to cause the etching reaction. Therefore, the etching speed can be said to be proportional to the partial pressure of the etching gas.

The following is a study of the relationship between the effective pumping speed and etching characteristics. For this example, a chlorine atom gas is used, the reaction product is $SiCl_4$, and the gas temperature is set to room temperature.

Figure 3:
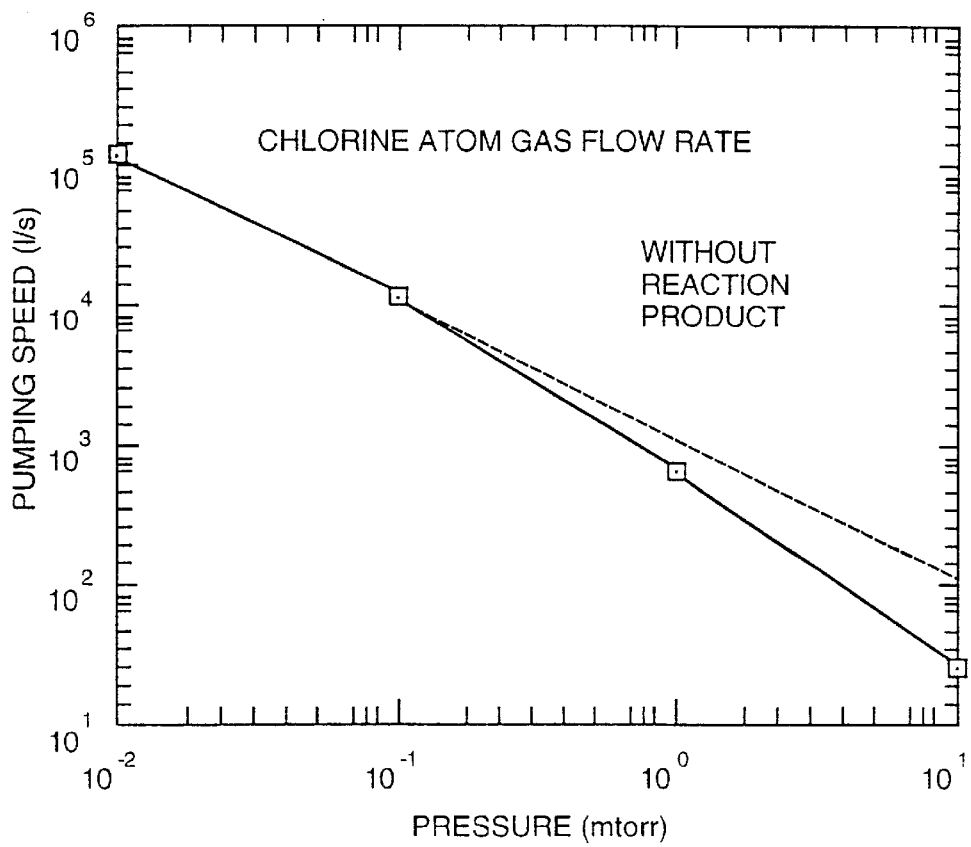
FIG. 3 is a diagram of the relationship between total pressure and effective pumping speed.

FIG. 3 shows the relationship between the total pressure P and the effective pumping speed S when changing only the effective pumping speed while keeping the etching gas flow rate constant for a gas flow rate of 100 sccm and a 5-inch wafer. The dotted line shows the relationship between the pressure and the pumping speed when no reaction occurs; that is, when equation (1) is effected. Although the equation (1) is effected in a low-pressure area when reaction occurs, the pumping speed decreases in a high-pressure area, because, if the reaction occurs, the number of gas particles decreases from four (chlorine atoms) to one ($SiCl_4$). Therefore, the pumping speed should be decreased by a value corresponding to the decrease of the number of particles in order to maintain the pressure.

Equation (1) is effected in the low-pressure area because the number of etching gas particles entering the vacuum chamber is much greater than the number of gas particles consumed by the etching reaction. Therefore, the partial pressure of etching gas rises in the low-pressure area.

Figure 4:
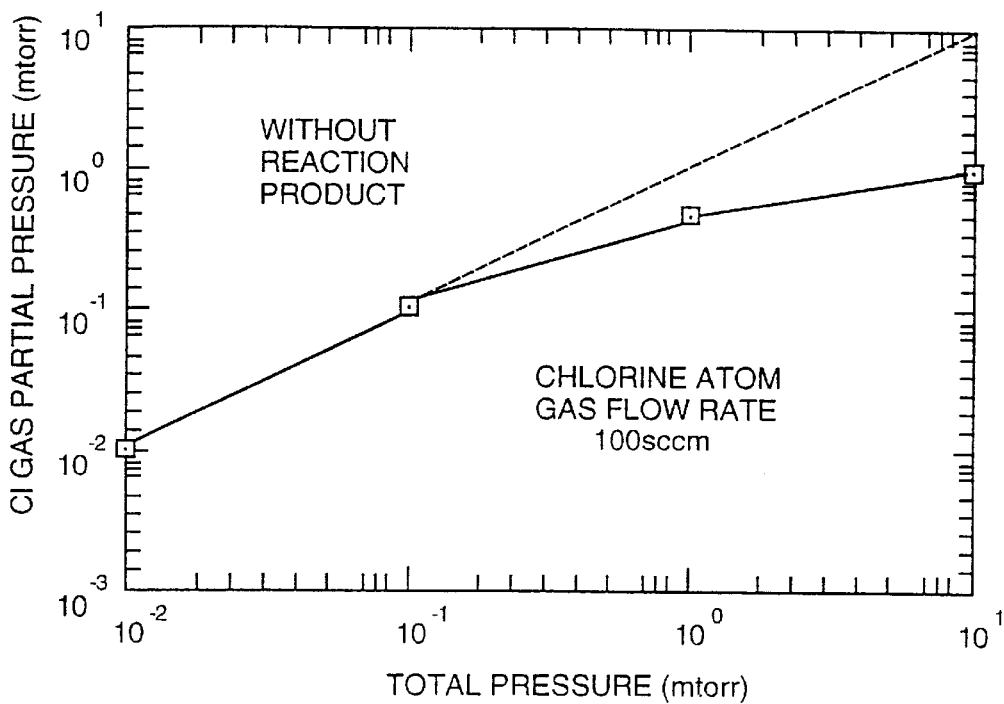
FIG. 4 is a diagram showing the relationship between total pressure and partial pressure of etching gas.

FIG. 4 shows the relationship between the total pressure and the partial pressure of etching gas when changing the exhaust speed while keeping the gas flow rate constant. In FIG. 4, the dotted line represents the etching gas pressure, i.e., $P=P_1$ when no etching reaction occurs. In the low-pressure area, the partial pressure of etching gas is responsible for almost all of the total pressure.

In the high-pressure area, however, the line for the partial pressure of etching gas goes downward from the line for $P=P_1$. This shows that the partial pressure of reaction products increases; that is, the percentage of reaction products in the gas increases.

Figure 5:
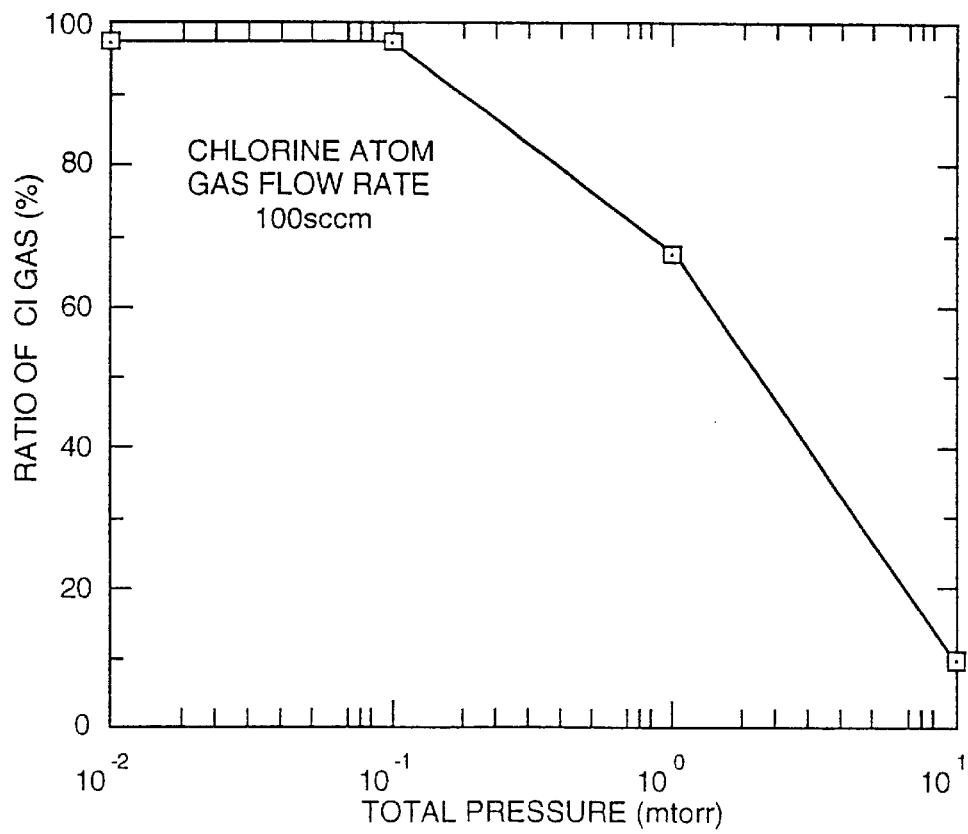
FIG. 5 shows the percentage of etching gas in the reaction chamber.

FIG. 5 shows the percentage of etching gas. As shown, the etching gas content is almost 100% of the total gas in the low-pressure area, but decreases as the pressure increases (as the pumping speed decreases).

Thus, as the pressure rises (as the pumping speed decreases), the percentage of reaction products in the gas increases. When the percentage of reaction products increases, re-dissociation of reaction products in plasma and reattachment to the wafer occur. The side-wall protective film produced during the chlorine- or bromine-based gas etching process is formed by the deposition of the etching reaction products from the resist and silicon. For the exemplary etching process, a 5-inch wafer is patterned at the gas flow rate of 100 sccm and the pressure of 5 mtorr. FIG. 5 shows that 70% of the gas is used for reaction products.

The amount of deposition from reaction products, however, can be controlled. To increase the amount of deposition from reaction products, the effective pumping speed is decreased and the percentage of reaction products in the gas is increased. To decrease the amount of deposition from reaction products, the effective pumping speed is increased and the percentage of reaction products in the gas decreased. To increase the effective pumping speed, the value of $(Q-\alpha WP)$ in the right side of equation (11) is increased. The upper limit $(Q-\alpha WP) \gg 0$ represents that the number of incoming etching gas particles is larger than the number of etching gas particles reacting with the wafer. This situation corresponds to the limit in which equation (1) is satisfied. Thus, almost all of the particles in the chamber are etching gas particles, and deposition from reaction products does not occur.

The limit $(Q-\alpha WP) \ll 0$ represents that the number of etching gas particles entering the wafer is larger than the number of incoming etching gas particles. At this limit, most particles in the chamber are reaction products, and the amount of deposition from reaction products is large.

As described above, the amount of deposition from reaction products is determined by the percentage of reaction products in the gas, which percentage is determined by the relationship between Q and $\alpha WP$. To decrease the amount of deposition from reaction products, the percentage of reaction products is decreased to 20% or less. For the example of FIG. 5, the percentage of reaction products in the chamber can be decreased to 20% or less if $Q/\alpha WP>3$.

For the above example, then, x equals ¼. When x equals 1, equation (11) can be written as shown below.

$$S=kTQ/P. \tag{12}$$

Thus, the equation (1) is satisfied.

When substituting equation (12) for equation (5), the following equation is obtained:

$$P_1=QP/(Q+\alpha WP). \tag{13}$$

The percentage of etching gas $P_1/P$ can be written as shown below:

$$P_1/P=Q/(Q+\alpha WP). \tag{14}$$

Substituting C for $Q/\alpha WP$, equation 14 can be rewritten as shown below:

$$P_1/P=C/(C+1). \tag{15}$$

In this case, equation (15) shows that the percentage of reaction product in the gas decreases to 20% or less; that is, equation (15) shows that the percentage of etching gas becomes 80% or more when C is greater than four. Thus, when $Q/\alpha WP$ exceeds three or four, no deposition from reaction products occurs. However, when $Q/\alpha WP$ is equal to or less than three or four, deposition from reaction products occurs.

As described above, reaction product deposition can be controlled simply by changing the effective pumping speed of a dry etching apparatus. However, when the gas flow rate is fixed, basic etching characteristics including the etching speed also change because the pressure changes. It is also possible to control reaction product deposition by adjusting the gas flow rate in accordance with the change of the effective pumping speed to keep the pressure constant.

Figure 6:
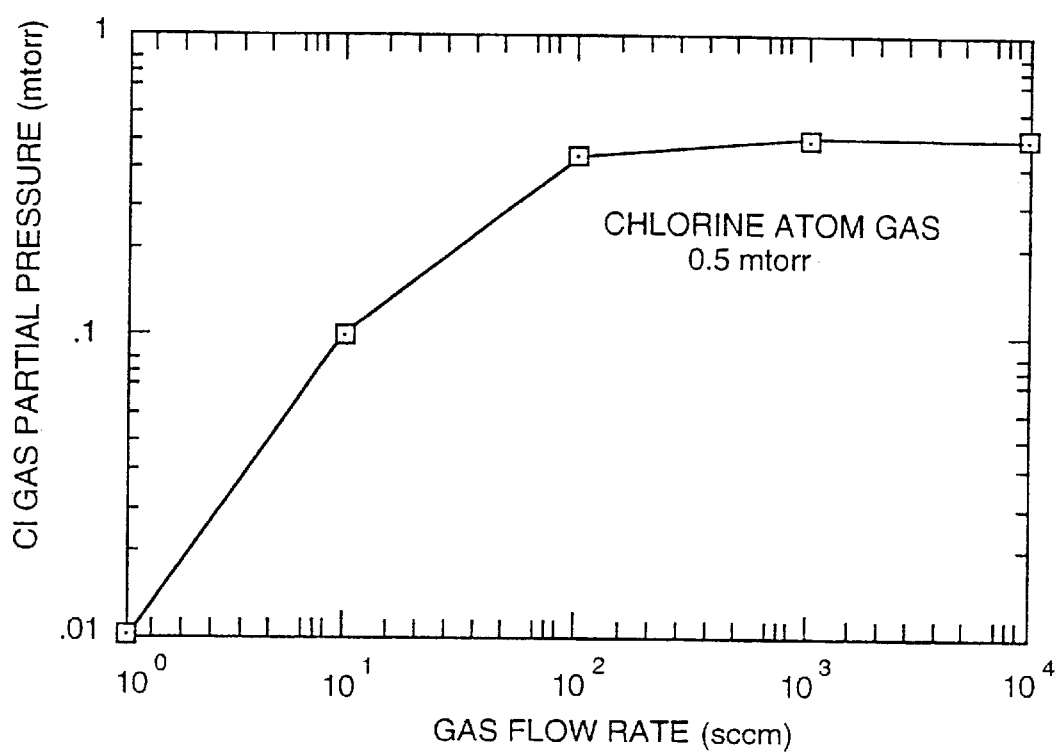
FIG. 6 shows the partial pressure of etching gas when changing the gas flow rate together with the effective pumping speed.

FIG. 6 shows the change of the partial pressure of etching gas when changing the gas flow rate together with the effective pumping speed so that the pressure is kept constant at 0.5 mtorr. The example in FIG. 6 is calculated with the same system as that of the sample in FIG. 5.

When $Q/\alpha WP$ is larger than three, the chamber is nearly completely occupied by etching gas. When $Q/\alpha WP$ is smaller than three, however, the partial pressure of etching gas decreases. In this case, the percentage of reaction products increases and deposition from reaction products occurs. Thus, deposition from reaction products can be controlled by changing the effective pumping speed even if the gas flow rate is similarly adjusted to keep the pressure constant.

Moreover, the shape of the side wall can be changed from the undercut or vertical shape due to side etching to the tapered shape by changing the effective pumping speed to thereby control the amount of deposition from reaction products.

Time-modulated etching, in which etching and deposition are alternately repeated, is realized by periodically changing the effective pumping speed without changing gases.

The amount of reaction product deposition is preferably controlled so that the thickness of the side-wall protective film around the interface is not decreased by decreasing the effective pumping speed in accordance with a decrease in the etched layer immediately before the end of the etching step. As a result, abnormal side etching around the interface can be prevented.

Because a change in the effective pumping speed of a dry etching apparatus is carried out in accordance with the change of plasma emission intensity or a change in the specific wavelength of the plasma emission, the effective pumping speed immediately before the end of the etching step can be controlled while monitoring the percentage of reaction products in the gas. Further, because the change in the effective pumping speed can be realized by monitoring the change of the area where an underlayer appears immediately before the end of the etching step, or by monitoring the change of the area of the etched layer, the effective pumping speed immediately before the end of the etching step can be controlled accurately.

Formation of the side-wall protective film caused by deposition from reaction products plays an important role in the etching of polycrystalline silicon and polycide using chlorine or bromine gas. However, it is not necessary to form the side-wall protective film during overetching. In accordance with the present invention, the effective pumping speed is increased during overetching so that deposition from reaction products does not occur. As a result, the etching speed is increased and the throughput is improved during overetching.

Moreover, because no side-wall protective film is formed on an overetching portion, isotropic etching is performed and etching residue on a step can effectively be removed. Furthermore, the throughput is improved because anisotropic etching can be changed to isotropic etching without changing gases.

Embodiment 1

For this embodiment, a resist mask is used to etch polycrystalline Si with $Cl_2$ plasma.

Figure 7A:
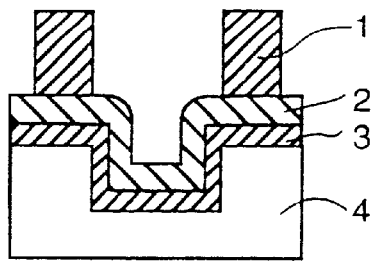
FIGS. 7(a)–7(e) illustrate a process for manufacturing a semiconductor device in accordance with an embodiment of the inventive dry etching method.

A sample structure is shown in FIG. 7(a). Silicon substrate 4 has a one-micron step, on which a $SiO_2$ film 3 having a thickness of 200 nm is formed as an underlayer before depositing polycrystalline Si layer 2 to a thickness of 500 nm. A resist mask 1 having a thickness of 1.5 $\mu$m is then formed on polycrystalline Si layer 2. By way of example, Si substrate 4 is a 5-inch wafer.

Using a $Cl_2$ gas plasma, etching is carried out at a pressure of 5 mtorr and using a gas flow rate of 100 sccm, the plasma being generated by microwave discharge. In this case, the effective pumping speed of a dry etching apparatus is set to 170 l/s. The wafer temperature is set to 10° C., and a 2-MHz RF bias is applied to the Si substrate 4.

Figure 7D:
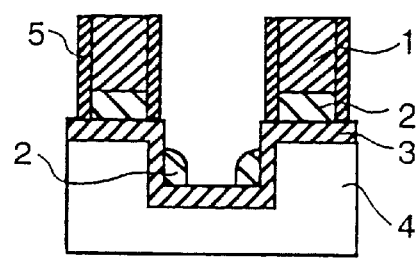
Figure 7B:
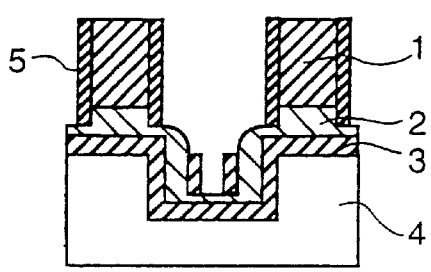

Under these conditions, side etching normally occurs. However, when a resist mask is used, side etching is controlled because the side-wall protective film 5 is formed, as shown in FIG. 7(b). For the etching conditions outlined above, Q is set to $4.18 \times 10^{19}$ (1/s), $\alpha WP$ is set to $2.18 \times 10^{20}$ (1/s), and $Q/\alpha WP$ thus equals 0.19. Therefore, the percentage of reaction products is as high as about 80%, and deposition from the reaction products occurs so that side-wall protective film 5 is formed at a vertical portion of the sample. At portions other than the side wall, deposit is immediately removed because etching progresses with incoming gas and, thus, no deposit film is formed. However, the etching speed is decreased compared with the condition in which no deposition from reaction products occurs. Thus, for the present etching conditions, the etching speed is 300 nm/min.

Figure 7E:
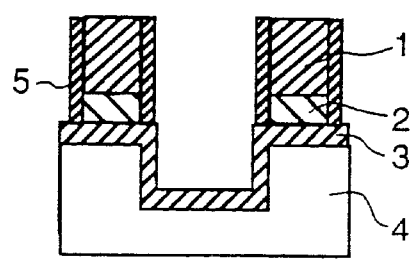
Figure 7C:
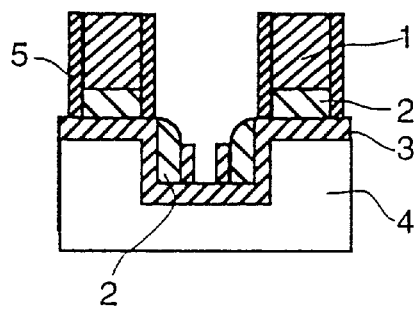

FIG. 7(c) illustrates a state in which the etching of the polycrystalline Si film is completed. Etching residue of polycrystalline Si layer 2 is present on the step side wall because high anisotropic etching is performed by controlling side etching. The overetching step is thus necessary to remove the etching residue.

For the existing dry etching method, the overetching step conditions are the same as the etching step conditions, or overetching is performed by changing gases. For this embodiment, however, overetching is performed by increasing the effective pumping speed.

For the overetching, the gas pressure is set to 0.5 mtorr, the gas flow rate is set to 160 sccm, and the other conditions are set similarly to those of the etching step previously described. In this case, however, the effective pumping speed is set to 4000 l/s.

For these etching conditions, because Q equals $6.69 \times 10^{19}$ (1/s), $\alpha WP$ equals $2.18 \times 10^{19}$ 1/s, and $Q/\alpha WP$ equals 3.1, giving a percentage of reaction products of less than 20%. Therefore, because no deposition from reaction products occurs, the etching speed increases and isotropic etching progresses. An etching speed of 600 nm/min is obtained, which is two times the speed of the previous etching step (FIG. 7(d)).

In this case, because the gas pressure is set as low as 0.5 mtorr, incoming ions have a high directivity. Therefore, the side-wall protective film 5 is only slightly, if at all, etched. Though the side-wall protective film of the etching residue remains for a period of time, it is eventually removed because the vertical portion of the etching residue disappears when overetching is progressed to a certain extent. Then, isotropic etching subsequently progresses and overetching can be performed without leaving the etching residue (FIG. 7(e)).

FIG. 1 shows time charts for the above etching conditions. FIG. 1(a) is a time chart showing the change of the effective pumping speed in accordance with elapsed time, FIG. 1(b) is a time chart showing the change of the etching gas flow rate in accordance with elapsed time, FIG. 1(c) is a time chart showing the change of the gas pressure in accordance with elapsed time, and FIG. 1(d) is a time chart showing the change of percentage of reaction products. By increasing the effective pumping speed under overetching, the etching speed under overetching can be doubled and isotropic etching realized. The overetching time can thus be decreased to one-half or less than the existing overetching time.

As a result, it is possible to prevent a short circuit from occurring due to a very small amount of etching residue. Also, because the percentage of carbon in plasma resulting from the resist decreases in the overetching step, the selectivity for the $SiO_2$ layer 3 greatly increases, and etching with small damage can be performed.

The present embodiment describes polycrystalline Si etching using chlorine plasma and a resist mask. The present invention is effective for every type of etching using a side-wall protecting film and requiring overetching. For example, it is also effective for the "$Cl_2+O_2$" etching with an oxide film mask, etching of polycide, etching with a bromine-based gas plasma, and etching of metals including aluminum and tungsten.

Embodiment 2

Figure 8:
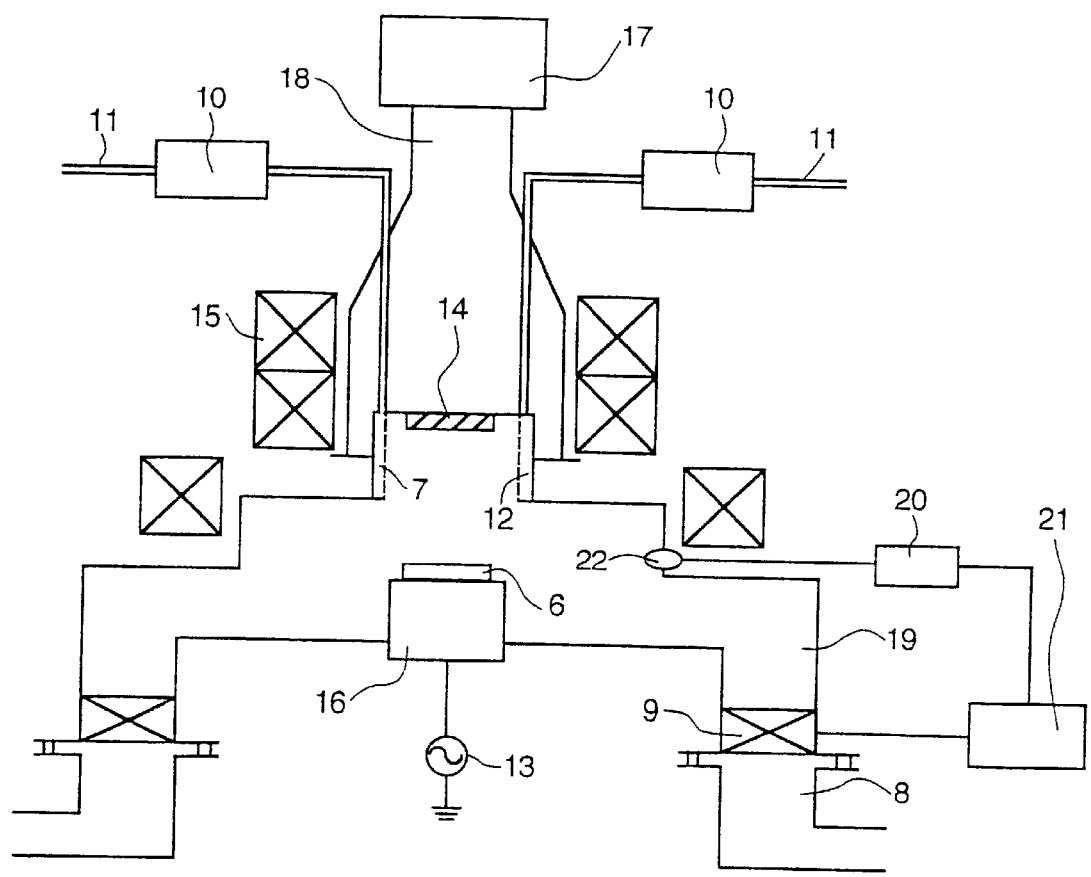
FIG. 8 is a sectional view of an embodiment of the dry etching apparatus constructed in accordance with the teachings of the present invention.

FIG. 8 shows a dry etching apparatus representing another embodiment constructed according to the teachings of the present invention. This apparatus introduces an etching gas into a vacuum chamber 19, generates electromagnetic wave radiation of 2.45 GHz with a microwave generator 17, and sends the electromagnetic wave radiation to the vacuum chamber 19 through a waveguide 18 and a microwave entrance window 14 to generate a gas plasma with the etching gas. For high-efficiency discharge, solenoid coils 15 are arranged around vacuum chamber 19 to generate the high-density plasma through electron cyclotron resonance using a magnetic field of 875 gauss. The vacuum chamber 19 contains a sample stage 16 on which a wafer 6 is set to be etched with the gas plasma.

The etching gas is lead into the vacuum chamber 19 through a gas supply port 7, which may be covered with a mesh, or may be provided with small holes, through a gas pipe 11, gas flow rate controller 10, and buffer chamber 12. The etching gas is exhausted from the vacuum chamber 19 by exhaust pump 8. In this case, the pumping speed can be changed via a conductance valve 9.

Because a buffer chamber 12 is provided, and because the gas releasing area is increased by the structure of gas supply port 7, the velocity of gas can be decreased to one-third or less than the speed of sound, and a uniform flow is realized. Moreover, two or more gas supply ports 7 may be arranged so that they are symmetric with respect to the central axis of the vacuum chamber 19 to lead the gas from the gas pipe 11 to the vacuum chamber 19. This structure thereby makes possible the control of the bias of the gas distribution in the plasma gas.

The sample stage 16 is equipped with an RF power source 13 so that an RF bias of 400 kHz to 13.56 MHz can be applied. If the sample stage 16 includes a cooling system and a heating system, etching can be influenced by controlling the wafer temperature.

Plasma emission from the gas plasma is received by a light receiving apparatus 22 to determine the spectrum of the plasma emission. Light receiving apparatus 22 is operably associated with a photoemission spectroscope and photodetector jointly represented by reference numeral 20. The photoemission spectroscope and photodetector 20 detects spectra having a specific wavelength, and converts light intensity into electrical information to be sent to a batch control unit 21. The photoemission spectroscope and photodetector 20 can measure not only spectra having a specific wavelength, but the light intensity of the entire plasma emission.

Batch control unit 21 further controls the operation of conductance valve 9. In accordance with the construction described above, the effective pumping speed of the dry etching apparatus can be controlled in accordance with the change of plasma emission intensity.

Figure 9:
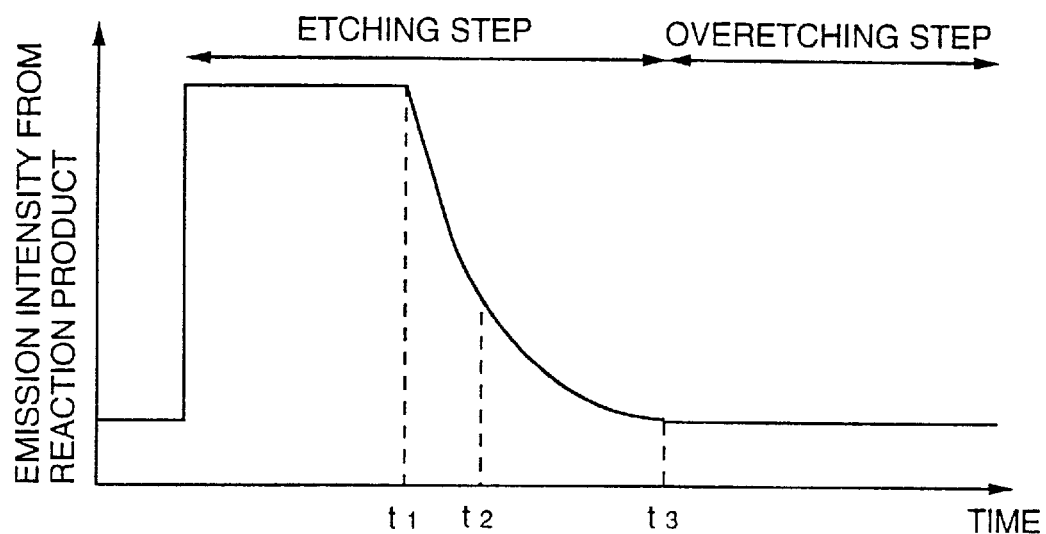
FIG. 9 shows the plasma emission intensity change for conventional dry etching.
Figure 10A:
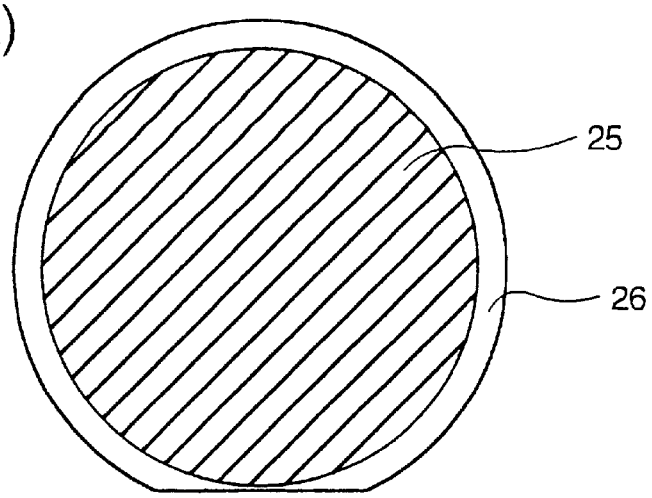
FIGS. 10(a)–10(c) illustrate the change in area of a layer that is etched immediately before the etching step ends.
Figure 10B:
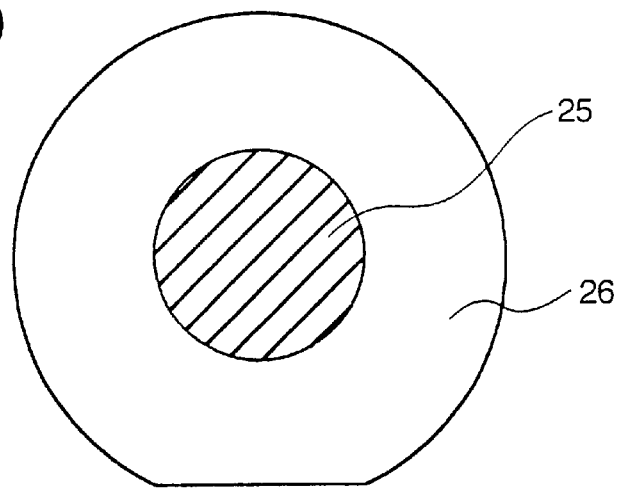
Figure 10C:
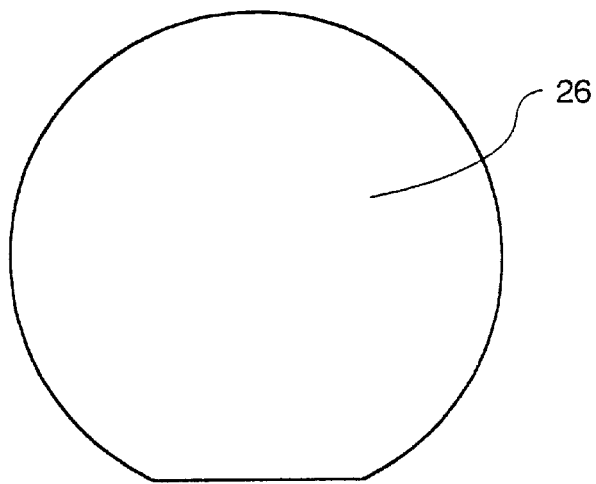

FIG. 9 shows how the emission intensity resulting from reaction products changes for the conventional dry etching apparatus. The emission intensity resulting from the reaction products is kept constant during the etching step, and then slowly decreases immediately before the end of the etching step because the area of the layer 25 to be etched decreases slowly, and the underlayer 26 begins to appear, as shown in FIG. 10. The time for the emission intensity to begin this decrease ($t_1$ in FIG. 9) corresponds to the time for the layer to start disappearing when the etching speed is maximized (FIG. 10(a)). When the emission intensity is approximately half ($t_2$ in FIG. 9), the area of the layer is also approximately half (FIG. 10(b)). When the layer 25 is completely etched (FIG. 10(c)), the emission intensity resulting from reaction products all but disappears ($t_3$ in FIG. 9). However, overetching is still necessary because etching residue of the layer remains on the side wall.

When the area of layer 25 decreases as shown in FIG. 10(b), the amount of reaction products also decreases. As a result, the amount of deposition from the reaction products decreases. Therefore, the thickness of the side-wall protective film decreases. This state is shown in FIG. 11.

Figure 11A:
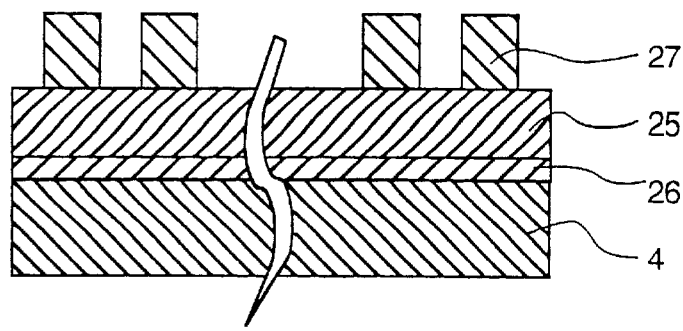
FIGS. 11(a)–11(d) illustrate a semiconductor device manufacturing process for explaining abnormal side etching.
Figure 11B:
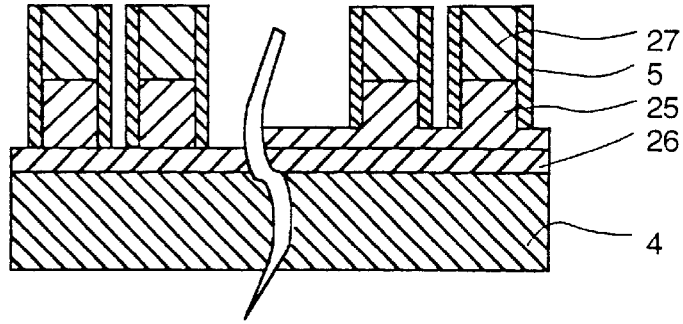
Figure 11C:
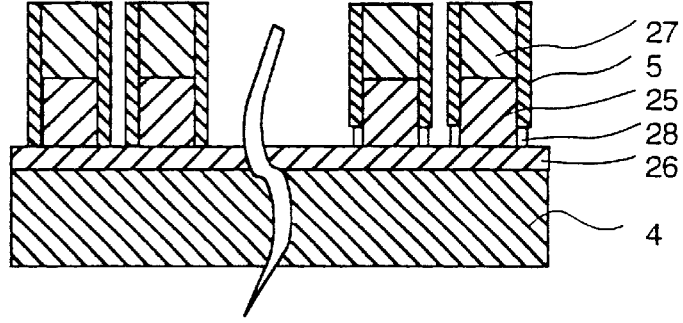
Figure 11D:
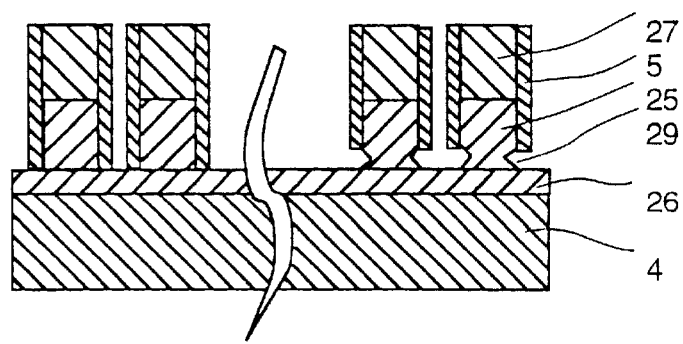

FIG. 11(a) shows the structure whereby underlayer 26 has been deposited on Si substrate 4, layer 25 has been deposited on underlayer 26, and mask 27 has been formed on layer 25. The state immediately before the end of the etching step is shown in FIG. 11(b). As shown, the side-wall protective film 5 has been formed on the pattern side wall. Where a high etching speed is present (the left side of FIG. 11(b)), the amount of reaction products is kept constant until the underlayer appears. Therefore, the side-wall protective film 5 is adequately formed up to the interface. At a portion having a low etching speed (right side of FIG. 11(b)), however, the area of layer 25 decreases, as shown in FIG. 10(b). Therefore, the thickness of the side-wall protective film 28 decreases around the interface with the underlayer 26 (right side of FIG. 11(c)). Thus, the side-wall protective film 28 is broken under overetching, and the abnormal side-etching portion 29 is easily produced at the interface as shown in FIG. 11(d).

Since the amount of reaction products in the gas can be maintained by decreasing the effective pumping speed in accordance with a decrease of the production of reaction products, the thickness of the side-wall protective film 5 can be maintained. The dry etching apparatus described in this embodiment makes it possible to monitor the emission intensity resulting from reaction products, and to control the effective pumping speed in accordance with the emission intensity. Therefore, the thickness of the side-wall protective film does not decrease, so that no abnormal side etching occurs.

Figure 12A:
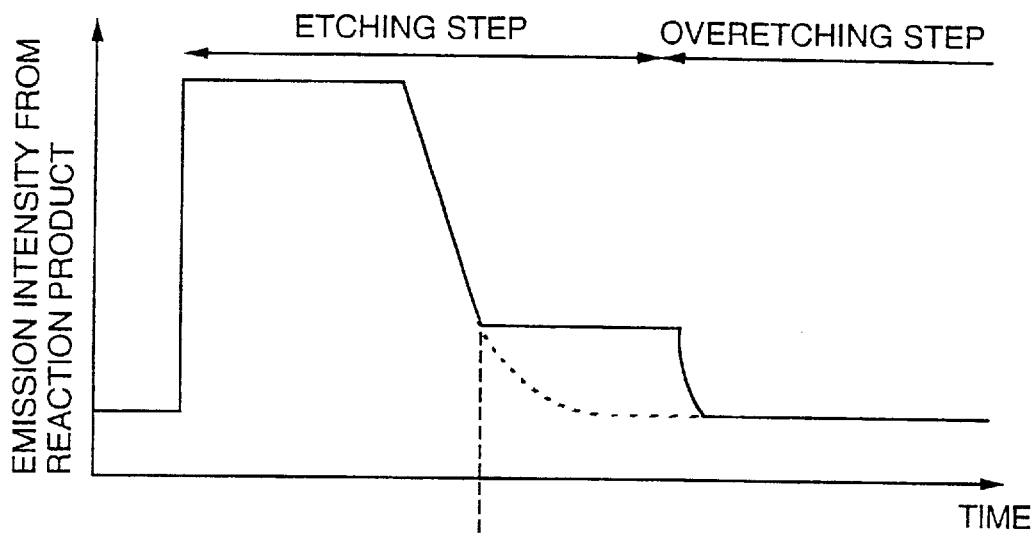
FIGS. 12(a)–12(b) show the changes of plasma emission intensity resulting from reaction products, and the conductance valve opening degree in an embodiment of the present invention, versus elapsed time.
Figure 12B:
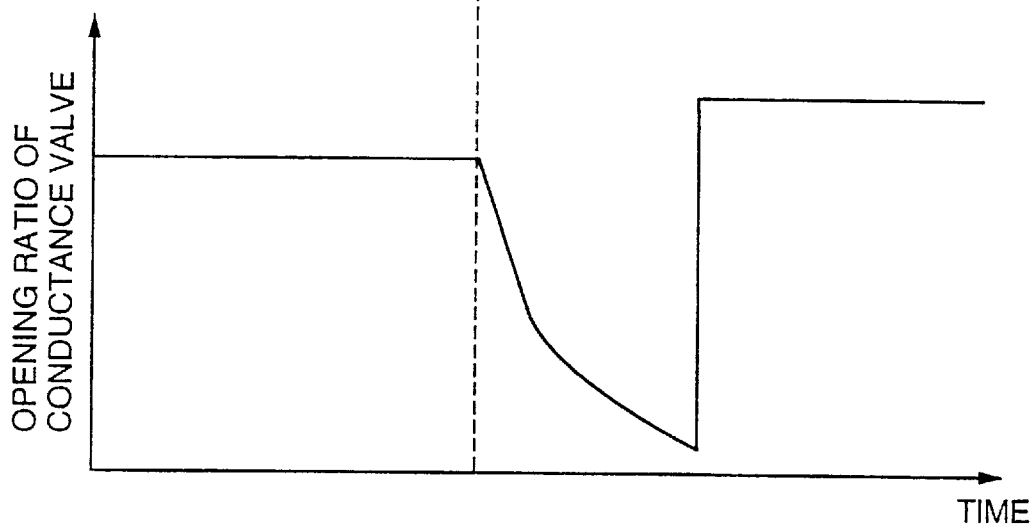

FIGS. 12(a) and 12(b) illustrate an example of effective pumping speed control. The conductance valve 9 is slowly closed in accordance with a decrease in emission intensity resulting from reaction products of approximately one-half immediately before the end of the etching step so that the emission intensity resulting from reaction products is kept constant. In this period, the thickness of the side-wall protective film 5 can be prevented from decreasing because the amount of deposition from reaction products is kept constant.

When the layer to be etched has been completely etched, the emission intensity resulting from reaction products starts decreasing even if the conductance valve is almost closed. Then, it is possible to open the conductance valve to begin the overetching step. However, because the effective pumping speed has already been decreased, the etching speed also decreases. Therefore, the emission intensity does not decrease for a considerable time.

For this embodiment, however, the conductance valve 9 is opened at the beginning of the overetching step by assuming that the timing when the conductance valve has closed up to 90% is the end point of the etching step, in order to improve throughput. Thus, the thickness of the side-wall protective film 5 can be prevented from decreasing, and abnormal side etching does not occur, by decreasing the effective pumping speed immediately before the end of the etching step while monitoring the emission intensity.

Figure 13:
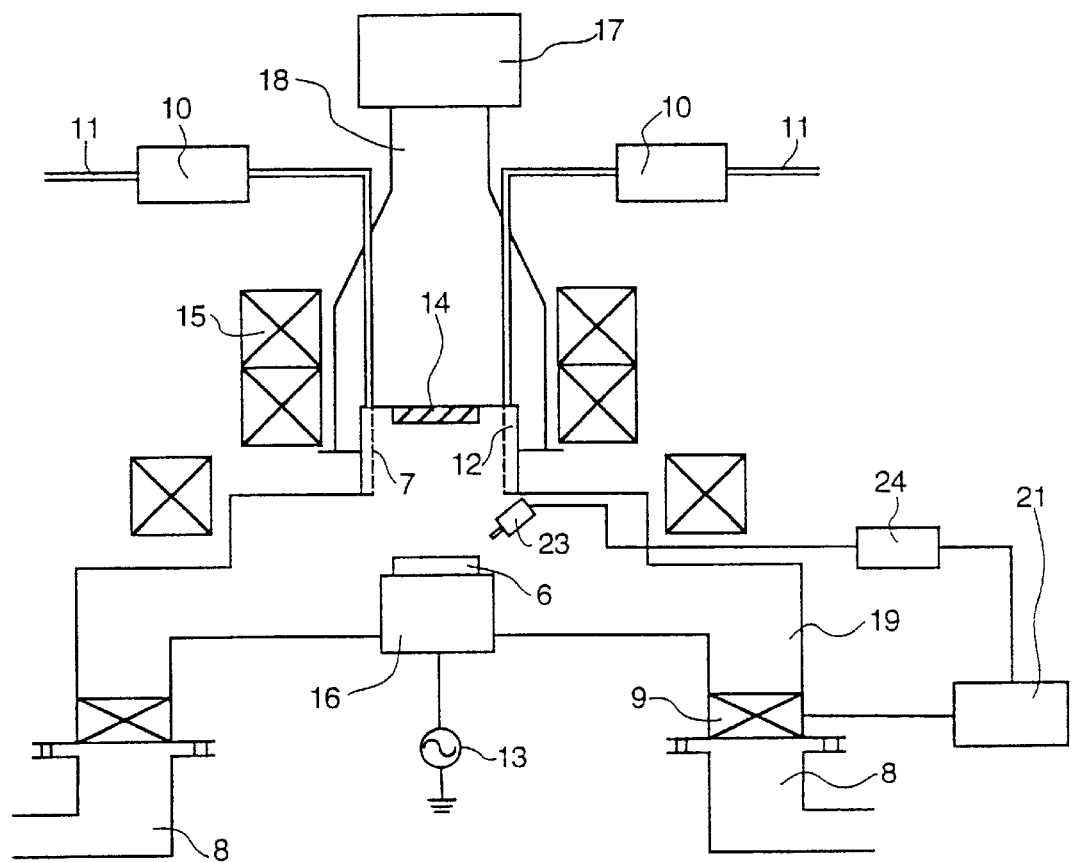
FIG. 13 is a sectional view of a dry etching apparatus constructed according to the teachings of the present invention.

Depending upon the etching conditions, abnormal side etching may not occur even if overetching begins when the conductance valve is up to 80% closed, or it may occur by the time the overetching step begins after the conductance valve is closed up to 90% or more. Therefore, to further accurately control the effective pumping speed, the area of the layer or the area of the exposed underlayer is monitored instead of monitoring the emission intensity. FIG. 13 shows an embodiment of this construction.

The embodiment shown in FIG. 13 incorporates a video camera 23 and image processor 24 in place of the light receiving apparatus 22 and the photoemission spectroscope and photodetector 20 of the dry etching apparatus illustrated in FIG. 8. The change in area of the layer 25 being etched is monitored by camera 23 immediately before the end of the etching step, which area is converted into electrical information by the image processor 24 and sent to batch control unit 21. By adjusting the effective pumping speed in accordance with the change in area of the etching layer and of the underlayer, the thickness of the side-wall protective film can be kept constant and the abnormal side etching can be prevented.

The effective pumping speed can further accurately be adjusted by combining this embodiment with the monitoring method using the plasma emission intensity. For example, while adjusting the effective pumping speed so that the plasma emission intensity becomes constant immediately before the end of the etching step, the timing for starting the overetching step can accurately be determined by monitoring the time that the layer disappears with the camera system.

Embodiment 3

Figure 14:
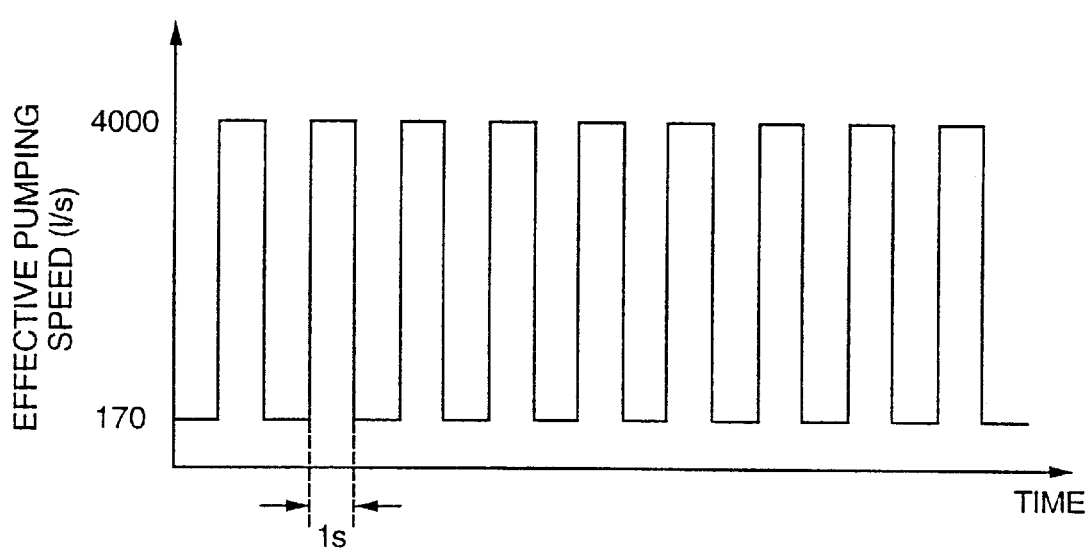
FIG. 14 shows the change of effective pumping speed versus time in an embodiment of the present invention.

Time modulation etching, in which depositing and etching gases are changed by turns, can be performed with one type of gas by using the characteristic that deposition from reaction products occurs or does not occur depending on the effective pumping speed. For this embodiment, shown in FIG. 14, the effective pumping speed is periodically changed at 170 l/s and 4000 l/s when polycrystalline Si is etched with $Cl_2$ plasma using a resist mask. When the effective pumping speed is 170 l/s, the pressure is set to 5 mtorr, the gas flow rate to 100 sccm, and the water temperature to 10° C. In this case, deposition from reaction products occurs. When the effective pumping speed is 4000 l/s, the gas pressure is set to 0.5 mtorr, and the gas flow rate is set to 160 sccm. In this case, the etching speed increases and isotropic etching progresses because no deposition from reaction product occurs.

As just described, the time modulation etching in which deposition and etching are periodically repeated can be performed with only one type of gas, and accurate etching free from the micro loading effect is realized.

Embodiment 4

The percentage of reaction products can be changed by changing the effective pumping speed. Therefore, because the deposition speed can be controlled, it is possible to control the taper angle for tapered etching in accordance with the effective pumping speed.

Figure 15A:
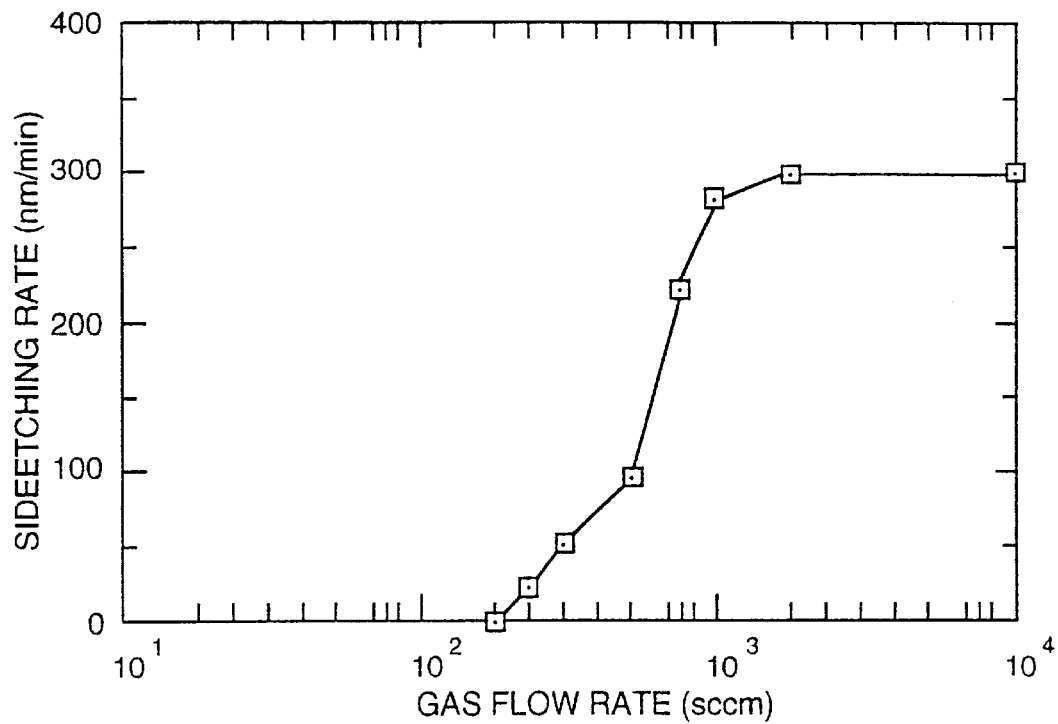
FIGS. 15(a)–15(b) show the relationship between effective pumping speed and side-wall shape.
Figure 15B:
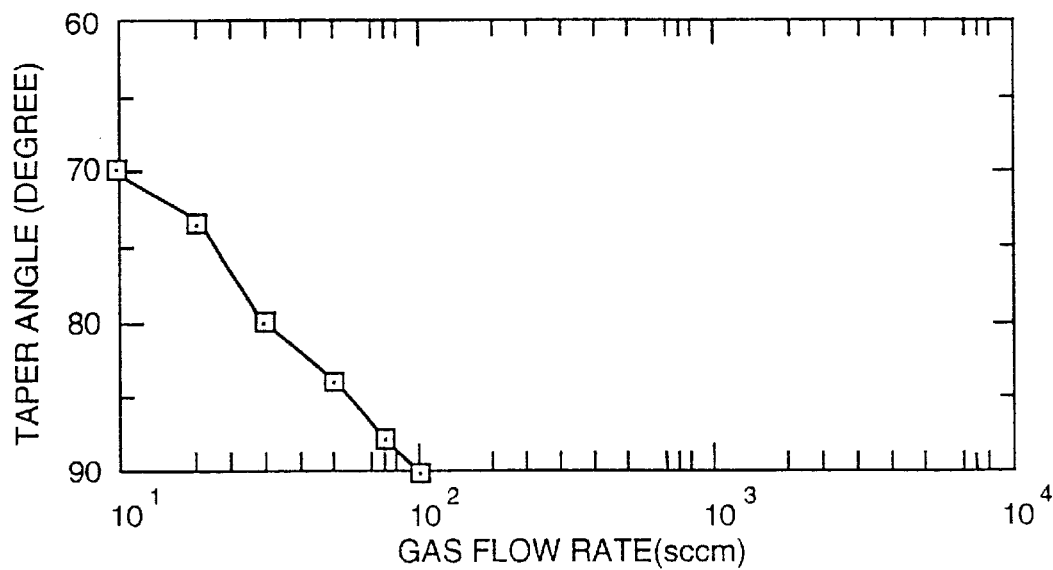

FIG. 15 shows an example of the relationship between the effective pumping speed and the side-wall shape. The characteristics shown in FIG. 15 is for etching of polycrystalline Si on a 5-inch wafer with a resist mask and $Cl_2$ microwave plasma at a pressure of 5 mtorr and wafer temperature of 10° C.

Under these conditions, $\alpha WP$ equals $2.18 \times 10^{20}$ (1/s). Therefore, when increasing the effective pumping speed so that gas flows at a rate of Q equals $6.54 \times 10^{20}$ (1/s), which is three times larger than $\alpha WP$ equals $2.18 \times 10^{20}$, or 1600 sccm, an undercut shape is formed due to side etching because no deposition from reaction products occurs. When decreasing the effective pumping speed, then, the amount of side etching is decreased due to the effect on deposition from reaction products, and side etching does not occur at the gas flow rate of 200 sccm. When further decreasing the effective pumping speed, the amount of deposit increases due to deposition from reaction products, and a taper angle starts to appear. At a gas flow rate of 10 sccm, the taper angle is 70 degrees. Therefore, the side-wall shape can be controlled by changing the effective pumping speed.

Moreover, a structure in which an upper portion of a side wall is approximately vertical, a middle portion has a tapered angle, and a bottom portion is approximately vertical can be obtained by repeating the etching with the same conditions as just outlined, except that the gas flow rate is changed from, for example, 200 sccm to 10 sccm to 200 sccm.

Embodiment 5

This embodiment is generally directed to the proposition that, during the etching process, the effective exhaust rate in the etching chamber is changed from a first effective exhaust rate to a second effective exhaust rate, the first effective exhaust rate thus being higher or lower than the second effective exhaust rate. In a more particular embodiment, the effective exhaust rate may be progressively changed from the first effective exhaust rate to the second effective exhaust rate.

The reason for changing the effective exhaust rate during etching is that the thickness of the side-wall protective film produced by the reaction product also changes. As the amount of reaction product decreases, the thickness of the side-wall protection film may become insufficiently small, resulting in side etching. As the amount of the reaction product increases, however, the side-wall protection film becomes thicker, with the result that the processed geometry of the side-wall protection film has a taper, lowering the etch rate.

Thus, when the reaction product amount decreases, the effective exhaust rate should be reduced during the etching process to prolong the time that the reaction product stays in the chamber, allowing the side protection film of the reaction product to be readily formed, thereby suppressing the side etching. Conversely, when the reaction product increases, the effective exhaust rate should be increased during the etching process to shorten the time that the reaction product stays in the chamber, inhibiting the production of the side-wall protection film and thereby preventing the processed geometry from being tapered. Thus, high-speed etching that minimizes the reduction in etching rate is possible.

By progressively changing the effective exhaust rate between the first and second rates, the uniformity of thickness of the side-wall protection film can be ensured. This is important to maintaining anisotropy of the etch in the face of the phenomenon that the area of material being etched changes as a result of the material being removed from the surface of the wafer by the etching process. For example, in a polysilicon gate forming process, because the thickness of the polysilicon layer and the etch rate do not have a perfectly linear relationship, the etching area of the polysilicon layer progressively decreases immediately before the end of the etching. At the same time, the amount of reaction product generated also progressively decreases. Thus, by progressively changing the effective exhaust rate in accordance with the amount of reaction product generated, the thickness of the side-wall protection film can be more accurately controlled.

Embodiment 6

In the process of forming polysilicon gates on stepped portions, after planar portions of the polysilicon layer have been etched down through the thickness of the polysilicon layer in the main etching step, the polysilicon remaining on the stepped portions is removed in an overetching step. When the main etching step is performed by low temperature etching without using the side-wall protection film, abnormal side etching may occur during the overetching step. In such a case, the effective exhaust rate is reduced during the overetching step to form the side-wall protection film, thus enabling anisotropic etching with no abnormal side etch.

If the side-wall protection film is formed during the main etching step, there is no need to produce the side-wall protection film in the overetching step. In this case, the effective exhaust rate is increased in the overetching step to realize high-speed overetching that minimizes the influence of the reaction product.

Embodiment 7

When a material to be etched consists of a plurality of layers, the amount of reaction product generated during etching may differ from one layer to another. In a layer that produces a large amount of reaction product, the etch rate increases when the exhaust rate is increased, while in a layer which produces only a small amount of reaction product, the etch rate may fail to increase even if the exhaust rate is increased. Thus, when etching two or more such layers in one sequence, the effective exhaust rate is preferably reduced when etching a layer that produces a small amount of reaction product in order to reduce the etch rate of a mask without lowering the etch rate of the material to be etched, thereby improving the selectivity of the etching.

Embodiment 8

When the effective exhaust rate in the etching chamber is set to 800 liters/second or higher, it is possible to suppress the formation of the side-wall protection film made from the reaction product, and to perform a high-speed etching that minimizes a reduction in the etch rate caused by the reaction product. The higher the effective exhaust rate, the better the effect of the reaction product can be suppressed. But considering the size of the equipment, the effective exhaust rate must not exceed 100,000 liters/second.

On t he contrary, when the effective exhaust rate is set to 700 liters/second or lower, the time that the reaction product stays in the chamber becomes long, and the side-wall protection film will form. In other words, as the effective exhaust rate is reduced, the influence of the reaction product increases. It is noted that when the effective exhaust rate is lower that 1 liter/second, a problem arises that the control of the exhaust rate becomes difficult.

By changing the effective exhaust rate from 800–100,000 liters/second to 1–700 liters/second or from 1–700 liters/second to 800–100,000 liters/second during the etching process, it is possible, even during the etching process, to select between the high-speed processing, which suppresses the influence of the reaction product, and the side-wall protection process using the reaction product, thereby etching with high speed and good anisotropy.

Embodiment 9

During overetching, the area of the material being etched decreases, so that the amount of reaction product generated decreases. Although the side-wall protection film is formed even at the effective exhaust rate of 700 liters/second, it is preferred that the effective exhaust rate is set lower than 500 liters/second to form a stronger side-wall protection film. Hence, by changing the effective exhaust rate between 1–500 liters/second and 800–100,000 liters/second, it is possible during the overetching to select between the high-speed processing, which suppresses the influence of the reaction product, and the side-wall protection process using the reaction product, thus allowing high-speed etching with good anisotropy.

Embodiment 10

At an effective exhaust rate of more than 1,300 liters/second, the reaction product generated is exhausted at high speed to increase the amount of etching species supplied and thereby suppress the phenomenon (microloading) in which the etch rate decreases with the aspect ratio. When the effective exhaust rate is lower than 700 liters/second, the time in which the reaction product stays in the chamber becomes long, enabling the side-wall protection film to form. Therefore, by changing the effective exhaust rate between 1,300–100,000 liters/second and 1–700 liters/second, it is possible to suppress the microloading and at the same time obtain an etching geometry that prevents side etching by using the side-wall protection film.

Embodiment 11

As noted, during overetching, the processing area of the material being etched and the amount of reaction product generated both decrease. At this time, if the effective exhaust rate is set to less than 500 liters/second, the side-wall protection film can be formed to a sufficient thickness during the overetching. At an effective exhaust rate of more than 1,300 liters/second, the reaction product is exhausted at high speed to increase the amount of etching species supplied to suppress the microloading phenomenon, in which the etch rate decreases with the aspect ratio. Therefore, by switching the effective exhaust rate between 1,300–100,000 liters/second and 1–500 liters/second, it is possible to perform overetching without microloading, while suppressing the side etch by forming the side-wall protection film.

Embodiment 12

By keeping the gas flow constant and changing the pressure between the two predetermined values in order to change the effective exhaust rate, it is possible to change between the high-speed processing, which suppresses the influence of the reaction product, and the side-wall protection process using the reaction product, without degradation in the etching uniformity that might otherwise be caused by changes in gas flow, thereby realizing a high-speed etch with good anisotropy. A gas flow of more than 200 sccm allows high-speed processing that suppresses the influence of the reaction product. A gas flow of more than 100,000 sccm, however, is too great for practical processing.

When the pressure is set below 5 mTorr, the amount of ions striking the wafer at angles decreases, realizing a high anisotropy. However, when the pressure is below 0.01 mTorr, the electric discharge becomes unstable. At the other range, at a pressure higher than 10 mTorr, the number of neutral particles striking the wafer increases, so that the side-wall protection film is efficiently formed by the reaction product, but a pressure in excess of 1,000 mTorr destabilizes the electric discharge. Thus, the pressure preferably changes between the ranges of 0.01 mTorr–5 mTorr and 10 mTorr–1,000 mTorr.

Embodiment 13

By holding the pressure constant and changing the gas flow in order to change the effective exhaust rate, it is possible to change between the high-speed processing, which eliminates the influence of reaction product, and the side-wall protection process using the reaction product, without causing variations in the etch rate and selectivity that may accompany pressure change-induced variations in ion current density and plasma potential. This realizes high-speed etching with good anisotropy. When the pressure is set between 1 mTorr and 1,000 mTorr, a stable electric discharge can be obtained even when the gas flow is changed. In this pressure range, the use of a gas flow higher than 200 sccm offers high-speed processing with no influence of the reaction product. A gas flow of more than 100,000 sccm, however, is too great for practical processing. A gas flow less than 100 sccm results in a side-wall protection process that uses the reaction product, but the etching process requires at least 1 sccm of gas flow.

Embodiment 14

At a pressure less than 4 mTorr, the amount of neutral particles supplied to the bottom of a pattern with a high aspect ratio is relatively insufficient for the amount of ions, so that microloading is likely to occur. At a pressure more than 25 mTorr, the proportion of ions striking the pattern at an angle increases, resulting in a reduction in the amount of ions reaching the bottom of the pattern with a high aspect ratio, which in turn makes the microloading likely to occur and causes side etching by diagonally-incident ions. At an effective exhaust rate of less than 600 liters/second, the etch rate of $SiO_2$ is increased by the reaction product from a resist mask containing carbon atoms, reducing selectivity. Therefore, with a dry etching apparatus that can be set at an effective exhaust rate of more than 600 liters/second and a pressure of 4–25 mTorr, it is possible to perform a dry etching having a high selectivity without causing microloading and side etching.

Embodiment 15

When the pressure is below 4 mTorr, the amount of neutral particles at the bottom of the pattern with a high aspect ratio becomes too small for the amount of ions, making the microloading likely to occur. At a pressure higher than 25 mTorr, the amount of diagonally-incident ions increases, so that the amount of ions reaching the bottom of the pattern with a high aspect ratio decreases, making the microloading likely to occur and causing side etching by the diagonally-incident ions. At an effective exhaust rate below 600 liters/second, the etch rate of $SiO_2$ is increased because of the reaction product from the resist mask containing carbon atoms, thus reducing selectivity. Therefore, by performing dry etching at an effective exhaust rate of more than 600 liters/second and a pressure in the 4–25 mTorr range, it is possible to prevent microloading and side etching and obtain high selectivity.

Embodiment 16

Using the low temperature etching technique to suppress side etching, and setting the effective exhaust rate to higher than 800 liters/second, high-speed etching with good anisotropy can be realized without forming the side-wall protective film during the main etching step that etches the planar portions of the material to be processed. In this case, however, abnormal side etching may occur at the boundary between etched layer and underlayer during the overetching. Thus, during the overetching, the effective exhaust rate is set below 700 liters/second to form a side-wall protection film to prevent abnormal side etching.

Embodiment 17

During overetching, the area of the material being etched decreases, reducing the amount of reaction product generated. In this case, the effective exhaust rate is set below 500 liters/second to form a solid side-wall protection film to prevent abnormal side etching.

Embodiment 18

As a specific embodiment of the dry etching method performed according to several of the Embodiments described above, a polysilicon etching by $Cl_2$ plasma using a resist mask is performed at a gas flow rate of 200 sccm and with a pressure charged to 3 mTorr and 10 mTorr alternately. The effective exhaust rate is changed between 850 liters/second and 260 liters/second. By changing the pressure in this way, it is possible to etch with good anisotropy at a high etch rate of 600 nm/min while forming the side-wall protection film by the reaction product.

Embodiment 19

As another specific embodiment of the dry etching method of this invention, a polysilicon etching by $Cl_2$ plasma using a resist mask is described. Etching is performed at a pressure of 2 mTorr by changing the gas flow rate between 200 sccm and 100 sccm alternately, and changing the effective exhaust rate between 1270 liters/second and 640 liters/second. By changing the gas flow alternately in this way, etching with good anisotropy and at a high etch rate of 600 nm/min can be realized while forming the side-wall protective film by the reaction product.

Embodiment 20

As a further specific embodiment of the dry etching method of this invention, a process of continuous etching of a laminated layer consisting of a TiN layer and an overlying Al layer, that uses a mixture of a $Cl_2$ gas and a $BCl_3$ gas using a resist mask is described. At a pressure of 3 mTorr, when the etching is performed on the aluminum layer, a greater effective exhaust rate results in an increased etch rate; that is, an effective exhaust rate of 600 liters/second achieves an etch rate of 800 nm/min, and 800 liters/second realizes an etch rate of 1,000 nm/min. The total gas flow of the gas mixture at this time is 110 sccm for the effective exhaust rate of 600 liters/second and 150 sccm for 800 liters/second.

The etch rate of the TiN layer also increases as the effective exhaust rate is increased until it reaches 600 nm/min for an effective exhaust rate of 600 liters/second, after which the etch rate does not rise even if the effective exhaust rate is further increased. The etch rate of the resist, however, does increase with the effective exhaust rate. An etch rate of 200 nm/min is achieved for the effective exhaust rate of 600 liters/second and, for 800 liters/second, the etch rate is 300 nm/min. When etching is done at an effective exhaust rate of 800 liters/second, both the Al layer and the TiN layer can be etched at high rates, 1,000 nm/min for Al layer and 600 nm/min for TiN layer. The etch rate of the resist mask during the TiN layer etching is 300 nm/min, producing a TiN/resist selectivity ratio of two.

If the etching of the Al layer is performed at an effective exhaust rate of 800 liters/second while the TiN layer is etched at an effective exhaust rate of 600 liters/second, it is possible to etch both of the layers at high etch rates: 1,000 nm/min for Al and 600 nm/min for TiN—the rates that can be realized when these two layers are etched at the effective exhaust rate of 800 liters/second. Changing the effective exhaust rate in this manner allows the etch rate of the resist to be suppressed to 200 nm/min during the etching of the TiN layer, producing a TiN/resist selectivity ratio of three, and thus realizing a highly selective etching.

Embodiment 21

As a further specific embodiment of the dry etching method of this invention, polysilicon etching by $Cl_2$ plasma using a resist mask is described. At a pressure of 2 mTorr, etching is performed by changing the effective exhaust rate between 800 liters/second and 700 liters/second. The gas flow is set to 130 sccm and 110 sccm for an effective exhaust rate of 800 liters/second and 700 liters/second, respectively. By changing the effective exhaust rate alternately during the etching, it is possible to form the side-wall protection film when the effective exhaust rate is 700 liters/second and, at 800 liters/second, to perform a high-speed processing that suppresses the influence of the reaction product, thus realizing a high-speed etching with good anisotropy, but without side etching.

While this embodiment changes the effective exhaust rate between 800 liters/second and 700 liters/second, it is also possible to change it between 800 liters/second and 500 liters/second to produce a solid side-wall protection film even when the amount of reaction product generated becomes small during the overetching. If the effective exhaust rate is changed between 1,300 liters/second and 700 liters/second, it is possible to suppress the microloading phenomenon when patterns of different sizes are processed simultaneously, allowing a high-speed, anisotropic etching. Further, changing the effective exhaust rate between 1,300 liters/second and 500 liter/second eliminates the microloading phenomenon and produces a solid side-wall protection film during the overetching, thus realizing the high-speed etching with good anisotropy.

Embodiment 22

As a further specific embodiment of the dry etching method of this invention, polysilicon etching by $Cl_2$ plasma using a resist mask is described. During the main etching step, the pressure is set at 3 mTorr, the effective exhaust rate at 800 liters/second and the gas flow at 260 sccm. The wafer is cooled to −50° C. At this low temperature the side etching of polysilicon is suppressed, so that good anisotropic etching is assured even under conditions where the side-wall protection film is not formed. The effective exhaust rate of 800 liters/second, which eliminates the influence of the reaction product, allows a high-speed processing at the etch rate of 600 nm/min.

In the overetching step, even when the wafer is cooled to as low as −50° C., abnormal side etching is likely to occur at the boundary between the polysilicon and the underlying $SiO_2$. To prevent the abnormal side etching, this embodiment reduces the effective exhaust rate during the overetching step to 700 liters/second. The pressure is set at 3 mTorr and the gas flow at 230 sccm. With the effective exhaust rate set to 700 liters/second during the overetching step, the side-wall protection film is formed by the reaction product, preventing the abnormal side etching. The etch rate at this time is reduced to 500 nm/min because of the influence of the reaction product. Reducing the effective exhaust rate during the overetching step below 700 liters/second enables the side-wall protective film to be formed. But because, during the overetching step, the etching area of the polysilicon becomes small, reducing the amount of reaction product generated, it is preferred that the effective exhaust rate is set below 500 liters/second to form a stronger side-wall protection film. If the effective exhaust rate during the main etching step is set to 1,300 liters/second or higher, microloading can be suppressed during the main etching step.

Embodiment 23

As a further specific embodiment of the dry etching method of this invention, polysilicon etching by $Cl_2$ plasma using a resist mask is described. Pressure is set at 10 mTorr, the effective exhaust rate at 600 liters/second and the gas flow at 470 sccm. Under these conditions, the etch rate of polysilicon is 500 nm/min and the polysilicon/$SiO_2$ selectivity ratio is 50. The gas flow and the pressure are increased and when the pressure exceeds 25 mTorr, the etch rate decreases because of a reduction in the ion current density. At 30 mTorr the polysilicon etch rate is halved to 250 nm/min and the gas flow and the pressure are reduced. When the pressure is below 4 mTorr, however, microloading occurs due to a lack of etchant supply. Hence, a desirable pressure range for this process is 4–25 mTorr. When the effective exhaust rate is reduced below 600 liters/second, the polysilicon etch rate decreases while the etch rate of $SiO_2$ does not fall to a similar extent. This is believed to occur due to the carbon atoms in the reaction product accelerating the etching reaction of $SiO_2$. At the effective exhaust rate of 500 liters/second, the polysilicon/$SiO_2$ selectivity ratio is reduced to 10. Therefore, the preferred effective exhaust rate for this process is 600 liters/second or higher.

The advantages of the present invention as outlined above are confirmed by applying the teachings of the invention to the specifically-described etching apparatus, as well as to other apparatus such as a magnetron RIE (reactive ion etching) apparatus and a helicon RIE apparatus. Moreover, a similar effect occurs by applying the present invention's teachings to other etching materials than those described, such as aluminum, tungsten, tungsten-silicide, copper, GaAs, and silicon nitride films.

The various modifications of the invention described above will become apparent to those of ordinary skill in the art. All such modifications that basically rely upon the teachings through which the present invention has advanced the state of the art are properly considered within the spirit and scope of the invention.

We claim:

1. A method for manufacturing a semiconductor device having storage capacitors, comprising the following steps:

providing a body which includes a semiconductor substrate having steps into a chamber; and etching the body in the chamber by using plasma of an etching gas, while exhausting the chamber by using at least one pump;

wherein an effective exhaust speed of the chamber is not less than 600 liters/second; and wherein the effective exhaust speed is defined as follows:

$$1/S = 1/\sum_n Si + 1/C$$

where S is the effective exhaust speed,
Si is an exhaust speed of one pump,
n is the number of pumps, and
C is an exhaust conductance of the chamber.

2. A method for manufacturing a semiconductor device according to claim 1,
wherein a gas pressure of the chamber is not more than 25 mTorr.

3. A method for manufacturing a semiconductor device according to claim 1,
wherein a gas pressure of the chamber is not more than 10 mTorr.

4. A method for manufacturing a semiconductor device according to claim 1,
wherein the body is set at a point other than the ECR point.

5. A method for manufacturing a semiconductor device according to claim 1,
wherein a reaction product of the body and the etching gas has a quality of deposition with respect to the body.

6. A method for manufacturing a semiconductor device according to claim 1,
wherein the body has one of silicon, aluminum, tungsten, tungsten-silicide, copper, GaAs, silicon nitride and titanium nitride.

7. A method for manufacturing a semiconductor device according to claim 1,
wherein the etching gas includes Cl or Br.

8. A method for manufacturing a semiconductor device according to claim 1,
wherein the residence time of the etching gas in the chamber is not more than 300 msec.

9. A method for manufacturing a semiconductor device according to claim 1,
wherein a conductance of the chamber is not less than 2000 liters/second.

10. A method for manufacturing a semiconductor device having storage capacitors, comprising the following steps:
providing a body which includes a semiconductor substrate having steps into a chamber; and
etching the body in the chamber by using plasma of an etching gas, while exhausting the chamber;
wherein an effective exhaust speed of the chamber is not less than 600 liters/second; and
wherein a conductance of the chamber is not less than 2000 liters/second.

11. A method for manufacturing a semiconductor device according to claim 10,
wherein a gas pressure of the chamber is not more than 25 mTorr.

12. A method for manufacturing a semiconductor device according to claim 10,
wherein a gas pressure of the chamber is not more than 10 mTorr.

13. A method for manufacturing a semiconductor device according to claim 10,
wherein the body is set at a point other than the ECR point.

14. A method for manufacturing a semiconductor device according to claim 10,
wherein a reaction product of the body and the etching gas has a quality of deposition with respect to the body.

15. A method for manufacturing a semiconductor device according to claim 10,
wherein the body has one of silicon, aluminum, tungsten, tungsten-silicide, copper, GaAs, silicon nitride, and titanium nitride.

16. A method for manufacturing a semiconductor device according to claim 10,
wherein the etching gas includes Cl or Br.

17. A method for manufacturing a semiconductor device according to claim 10,
wherein the residence time of the etching gas in the chamber is not more than 300 msec.

18. A method for manufacturing a semiconductor device according to claim 10,
wherein the effective exhaust speed of the chamber is not less than 800 liters/second.

* * * * *